(12) United States Patent
Chang et al.

(10) Patent No.: US 10,043,812 B1
(45) Date of Patent: Aug. 7, 2018

(54) SEMICONDUCTIVE STRUCTURE WITH WORD LINE AND METHOD OF FABRICATING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/726,369

(22) Filed: Oct. 5, 2017

(30) Foreign Application Priority Data

Sep. 14, 2017 (CN) .......................... 2017 1 0826527

(51) Int. Cl.
*H01L 27/108* (2006.01)
*H01L 29/06* (2006.01)
*H01L 21/311* (2006.01)

(52) U.S. Cl.
CPC .. *H01L 27/10891* (2013.01); *H01L 27/10823* (2013.01); *H01L 29/0653* (2013.01); *H01L 21/31111* (2013.01)

(58) Field of Classification Search
None
See application file for complete search history.

(56) References Cited

U.S. PATENT DOCUMENTS

| 7,772,631 | B2* | 8/2010 | Schloesser | ........ H01L 27/10891 |
| | | | | 257/296 |
| 9,472,617 | B2* | 10/2016 | Jang | .................... H01L 29/0653 |
| 9,899,487 | B2* | 2/2018 | Lee | ...................... H01L 29/4236 |
| 2008/0048333 | A1* | 2/2008 | Seo | ........................ H01L 21/743 |
| | | | | 257/773 |
| 2012/0231605 | A1* | 9/2012 | Kim | .................. H01L 21/76224 |
| | | | | 438/424 |

(Continued)

OTHER PUBLICATIONS

Chang, Title of Invention: Semiconductor Device and Method for Fabricating the Same, U.S. Appl. No. 15/611,759, filed Jun. 1, 2017.

(Continued)

*Primary Examiner* — Lex Malsawma
(74) *Attorney, Agent, or Firm* — Winston Hsu

(57) ABSTRACT

A method of fabricating a semiconductive structure with a word line includes providing a substrate including a memory cell region and a peripheral region. A first trench and second trench are formed within the memory cell region, and a third trench is formed within the peripheral region. A width of the first trench is smaller than the second trench, and the width of the second trench is smaller than the third trench. A first silicon oxide layer fills up the first trench. A silicon nitride layer fills up the second trench and covers the third trench. A second silicon oxide layer is formed in the third trench. Part of the substrate within the memory cell region, part of the first silicon oxide layer, and part of the silicon nitride layer are removed to form a word line trench. Finally, a word line is formed in the word line trench.

9 Claims, 13 Drawing Sheets

(56) References Cited

U.S. PATENT DOCUMENTS

| | | | |
|---|---|---|---|
| 2015/0294975 A1* | 10/2015 | Nakata | H01L 27/10891 257/334 |
| 2015/0311297 A1* | 10/2015 | Im | H01L 29/4236 257/331 |
| 2016/0087035 A1* | 3/2016 | Kim | H01L 29/0653 257/368 |
| 2016/0197084 A1* | 7/2016 | Yoon | H01L 27/10876 438/270 |
| 2016/0284640 A1* | 9/2016 | Wang | H01L 27/0207 |
| 2017/0263723 A1* | 9/2017 | Lee | H01L 29/0642 |

OTHER PUBLICATIONS

Chang, Title of Invention: Semiconductor Device and Method for Fabricating the Same, U.S. Appl. No. 15/678,084, filed Aug. 15, 2017.

\* cited by examiner

SEMICONDUCTIVE STRUCTURE WITH WORD LINE AND METHOD OF FABRICATING THE SAME

BACKGROUND OF THE INVENTION

1. Field of the Invention

The present invention relates to a fabricating method of a semiconductive structure and method of fabricating the same, and more particularly to a semiconductive structure which can reduce parasitic capacitance.

2. Description of the Prior Art

As the development of electronic products tends towards miniaturization, the design of dynamic random access memory (DRAM) units becomes more highly integrated with higher density. Since a DRAM unit with a buried word line has the advantage of possessing a relatively long carrier channel length within a semiconductor substrate, thereby reducing capacitor leakage, it has been gradually used to replace conventional DRAM units with planar gate structures.

As the degree of integration of the memory increases, a pitch of a buried word line is gradually reduced, resulting in an increase in parasitic capacitance formed by the buried word lines at passing gate regions. During DRAM operations, the buried word lines at the passing gate regions become an electrode, and electrons will be accumulated on the buried word lines at the passing gate regions. The electrons flow into an adjacent drain region, leading to data loss in a capacitor associated with the drain region. Such a phenomenon is known as a row hammer effect.

SUMMARY OF THE INVENTION

The present invention provides a new semiconductive structure to avoid this row hammer effect.

According to a preferred embodiment of the present invention, a semiconductive structure with a word line includes a substrate divided into a memory cell region and a peripheral region. A first trench and a second trench are embedded in the substrate within the memory cell region, wherein a width of the first trench is smaller than a width of the second trench. A third trench is embedded in the substrate within the peripheral region, wherein the width of the second trench is smaller than a width of the third trench. A first silicon oxide layer is disposed at a lower portion of the first trench. A second silicon oxide layer is disposed at a sidewall of the second trench and a sidewall of the third trench. A silicon nitride layer fills in the second trench and covers the second silicon oxide layer in the third trench. A third silicon oxide layer is disposed within the third trench, wherein the second silicon oxide layer, the silicon nitride layer and the third silicon oxide layer fill up the third trench. A word line fills in the upper portion of the first trench, and covers the silicon nitride layer within the second trench, and part of the memory cell region, wherein a top surface of the silicon nitride layer overlapping the word line in the second trench is not lower than a top surface of the first silicon oxide layer overlapping the word line in the first trench.

A method of fabricating a semiconductive structure with a word line includes providing a substrate comprising a memory cell region and a peripheral region. Later, a first trench and a second trench are formed in the substrate within the memory cell region, and a third trench is formed in the substrate within the peripheral region, wherein a width of the first trench is smaller than a width of the second trench, and the width of the second trench is smaller than a width of the third trench. Next, a first silicon oxide layer is formed to fill up the first trench, and cover the second trench and the third trench. Subsequently, the first silicon oxide layer in the second trench and the third trench is removed. After that, a silicon nitride layer is formed to fill up the second trench and cover the third trench. Then, a second silicon oxide layer is formed in the third trench, wherein the second silicon oxide layer and the silicon nitride layer fill up the third trench. Later, part of the substrate within the memory cell region, part of the first silicon oxide layer, and part of the silicon nitride layer are removed to form a word line trench. Finally, a word line is formed in the word line trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 13 depict a method of method of fabricating a semiconductive structure with a word line, wherein:

FIG. 1 is a top view of a substrate divided into a memory cell region and a peripheral region;

FIG. 2 is a sectional view of FIG. 1 taken along lines A-A' and B-B';

FIG. 3 is a sectional view continuing from FIG. 2;

FIG. 4 is a sectional view continuing from FIG. 3;

FIG. 5 is a sectional view continuing from FIG. 4;

FIG. 6 is a sectional view continuing from FIG. 5;

FIG. 7 is a top view of steps continuing from FIG. 6;

FIG. 8 is a sectional view of FIG. 7 taken along lines A-A' and B-B';

FIG. 9 is a top view of steps continuing from FIG. 7;

FIG. 10 is sectional views of FIG. 9 taken along line A-A', line B-B' and line C-C';

FIG. 11 is a top view of steps continuing from FIG. 9;

FIG. 12 is sectional views of FIG. 11 taken along line A-A', line B-B' and line C-C'; and FIG. 13 depicts sectional views taken along line A-A' in FIG. 11 according to another preferred embodiment of the present invention.

DETAILED DESCRIPTION

Figure 1:
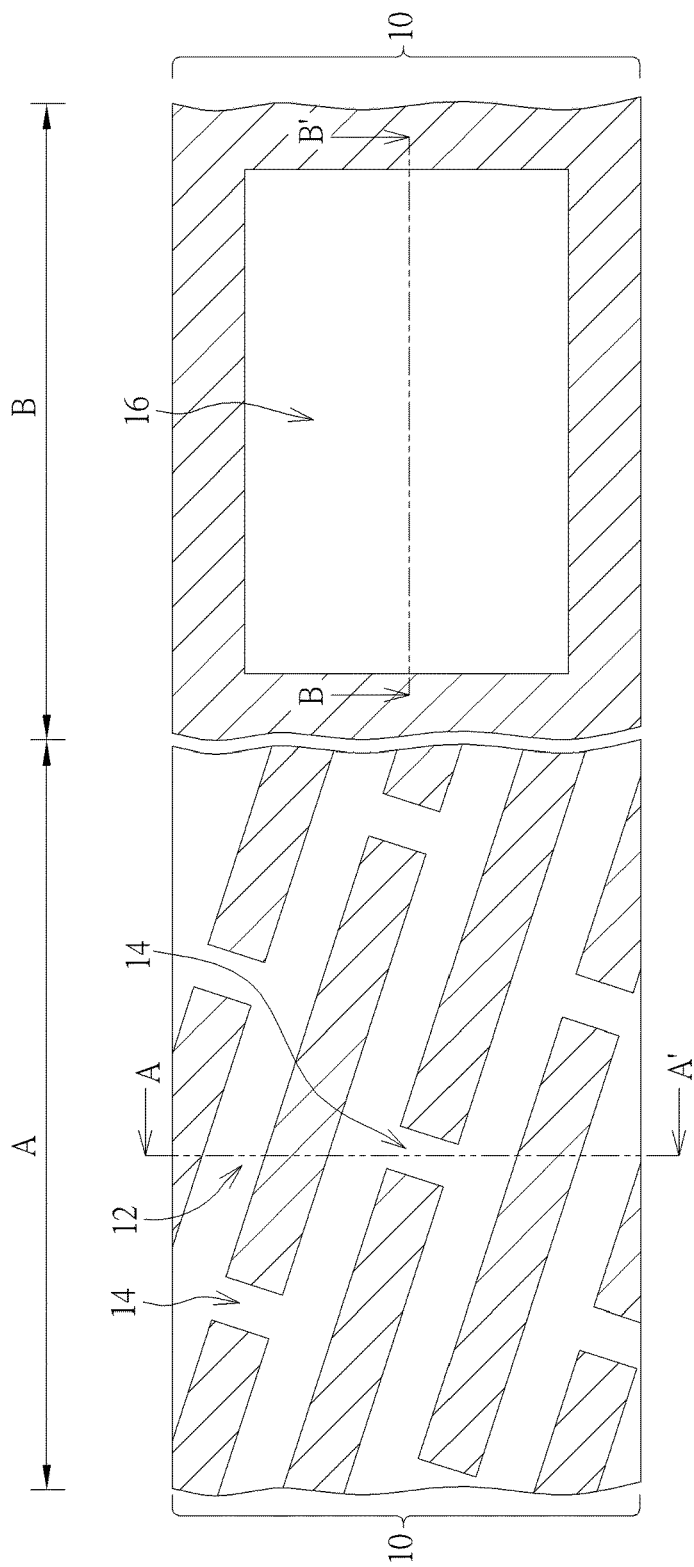
Figure 2:
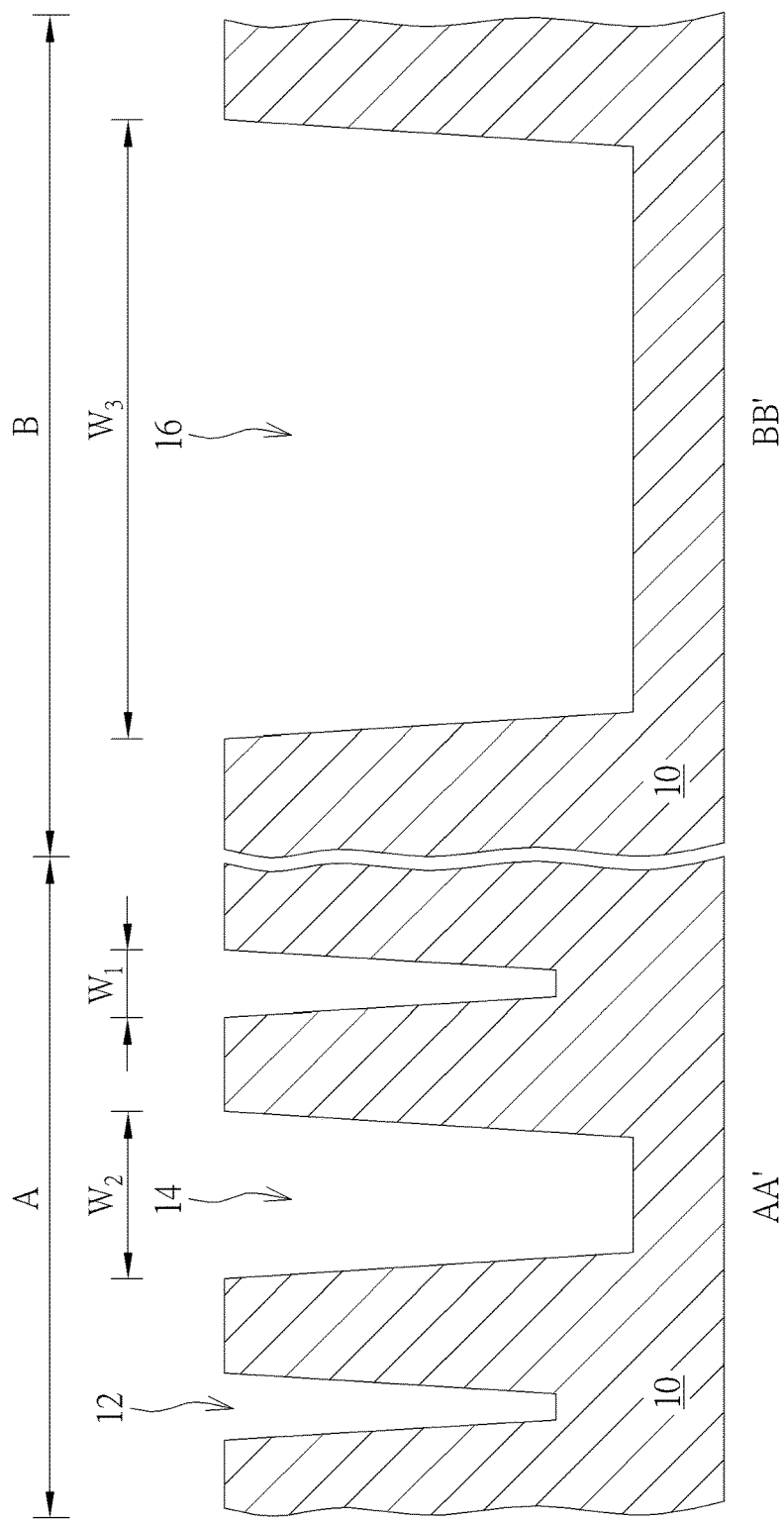

FIG. 1 to FIG. 12 depict a fabricating method of a semiconductive structure with a word line according to a preferred embodiment of the present invention. Please refer to FIG. 1 and FIG. 2, wherein FIG. 1 is a top view of a substrate divided into a memory cell region and a peripheral region. FIG. 2 is a sectional view of FIG. 1 taken along lines A-A' and B-B'. As shown in FIG. 1 and FIG. 2, a substrate 10 is provided. The substrate 10 may be a silicon substrate, a germanium substrate, a gallium arsenide substrate, or a silicon germanium substrate. In this embodiment, the substrate 10 is preferably silicon substrate. The substrate 10 is divided into a memory cell region A and a peripheral region B. Then, a first trench 12 and a second trench 14 are formed in the substrate 10 within the memory cell region A. A third trench 16 is formed in the substrate 10 within the peripheral region B. The first trench 12 and the second trench 14 define an active area (marked by slashed lines) within the memory cell region A. The third trench 16 defines an active area (also marked by slashed lines) within the peripheral region B.

Moreover, a width $W_1$ of the first trench 12 is smaller than a width $W_2$ of the second trench 14. The width $W_2$ of the second trench 14 is smaller than a width $W_3$ of the third trench 16. An end of the first trench 12 connects to the second trench 14. According to a preferred embodiment of the present invention, the width $W_1$ of the first trench 12 is about 20 nanometers. The width $W_2$ of the second trench 14 is about 50 nanometers. The width $W_3$ of the third trench 16 is greater than 50 nanometers, and preferably is greater than 100 nanometers. Furthermore, based on different requirements, the number of the first trench 12, the second trench 14 and the third trench 16 can be adjusted. In this embodiment, two first trenches 12, one second trench 14 and one third trench 16 are shown in the sectional view.

Figure 3:
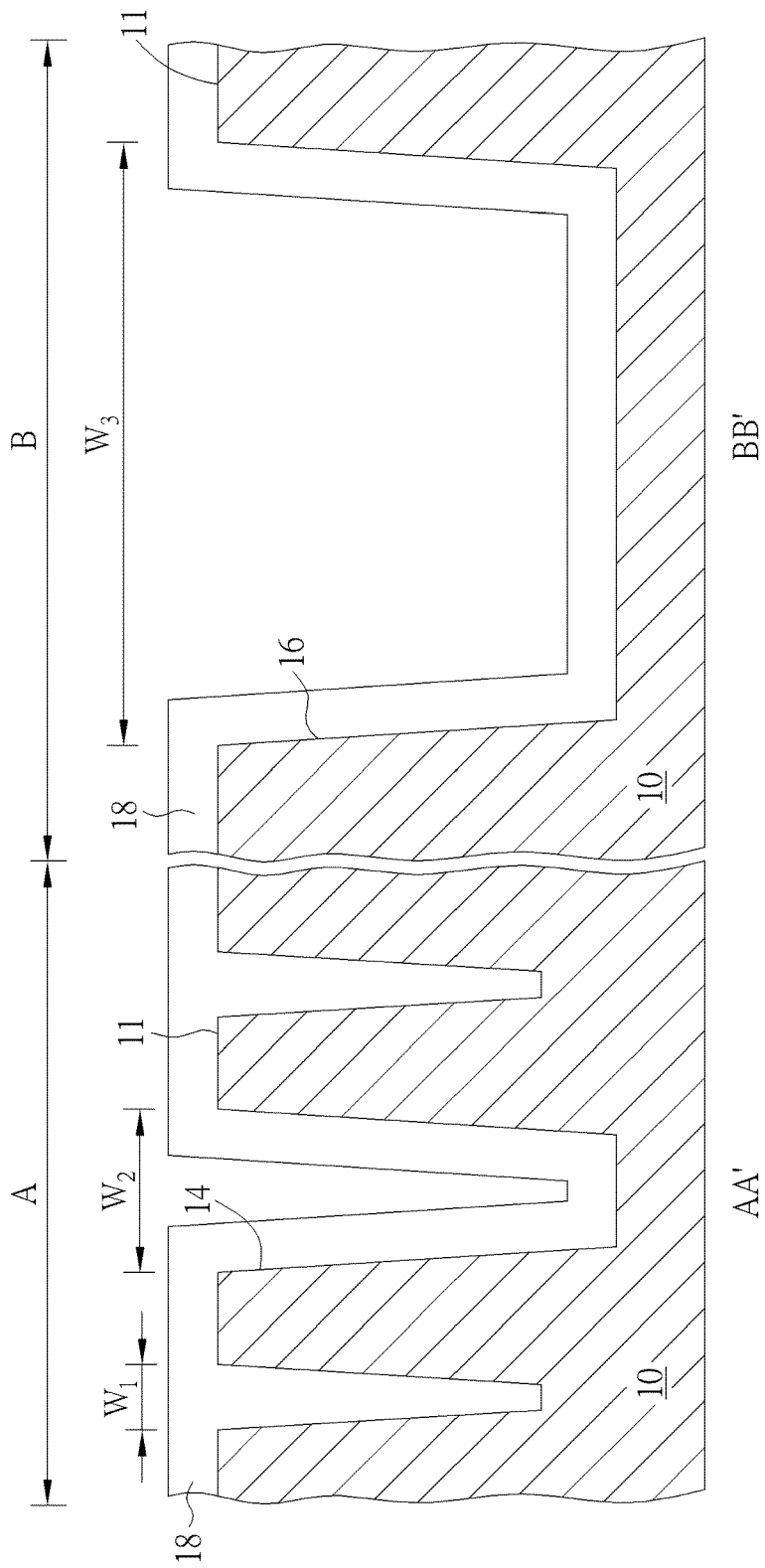

FIG. 3 is a sectional view continuing from FIG. 2. As shown in FIG. 3, a first silicon oxide layer 18 is formed to conformally cover the first trenches 12, the second trench 12, the third trench 13 and a top surface 11 of the substrate 10. The thickness of the first silicon oxide layer 18 is greater than half of the width $W_1$ of the first trenches 12. For example, if the width $W_1$ of the first trench 12 is 20 nanometers, the thickness of the first silicon oxide layer 18 should be greater than 10 nanometers; preferably, the thickness of the first silicon oxide layer 18 is 15 nanometers. Therefore, the first silicon oxide layer 18 entirely fills up the first trench 12, but only covers the sidewall and bottom of the second trench 14 and the sidewall and bottom of the third trench 16. The second trench 14 and the third trench 16 will not be filled up by the first silicon oxide layer 18. The first silicon oxide layer 18 may be formed by a chemical vapor deposition (CVD), a physical vapor deposition (PVD) or an atomic layer deposition (ALD). According to a preferred embodiment of the present invention, the first silicon oxide layer 18 is formed by the atomic layer deposition.

Figure 4:
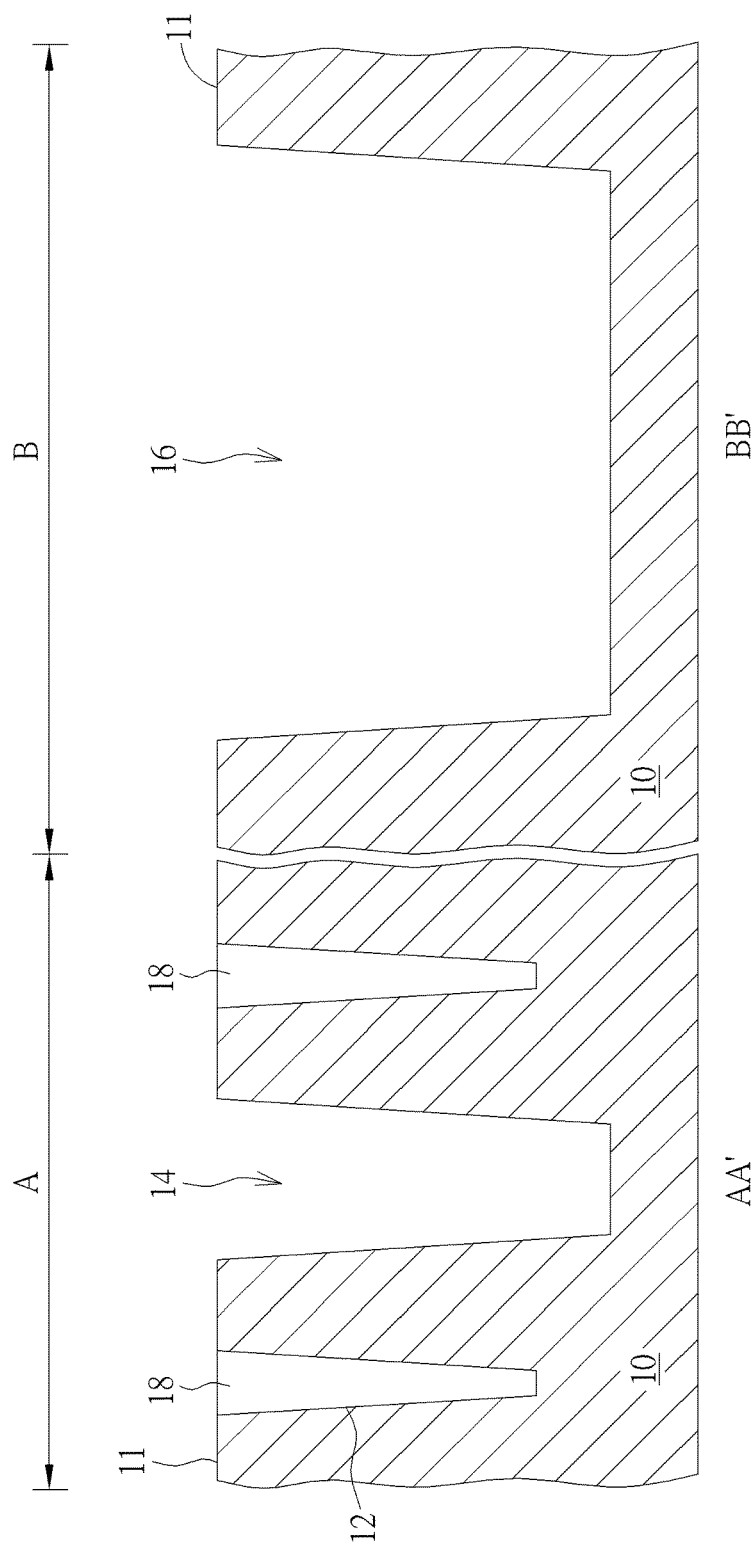
Figure 5:
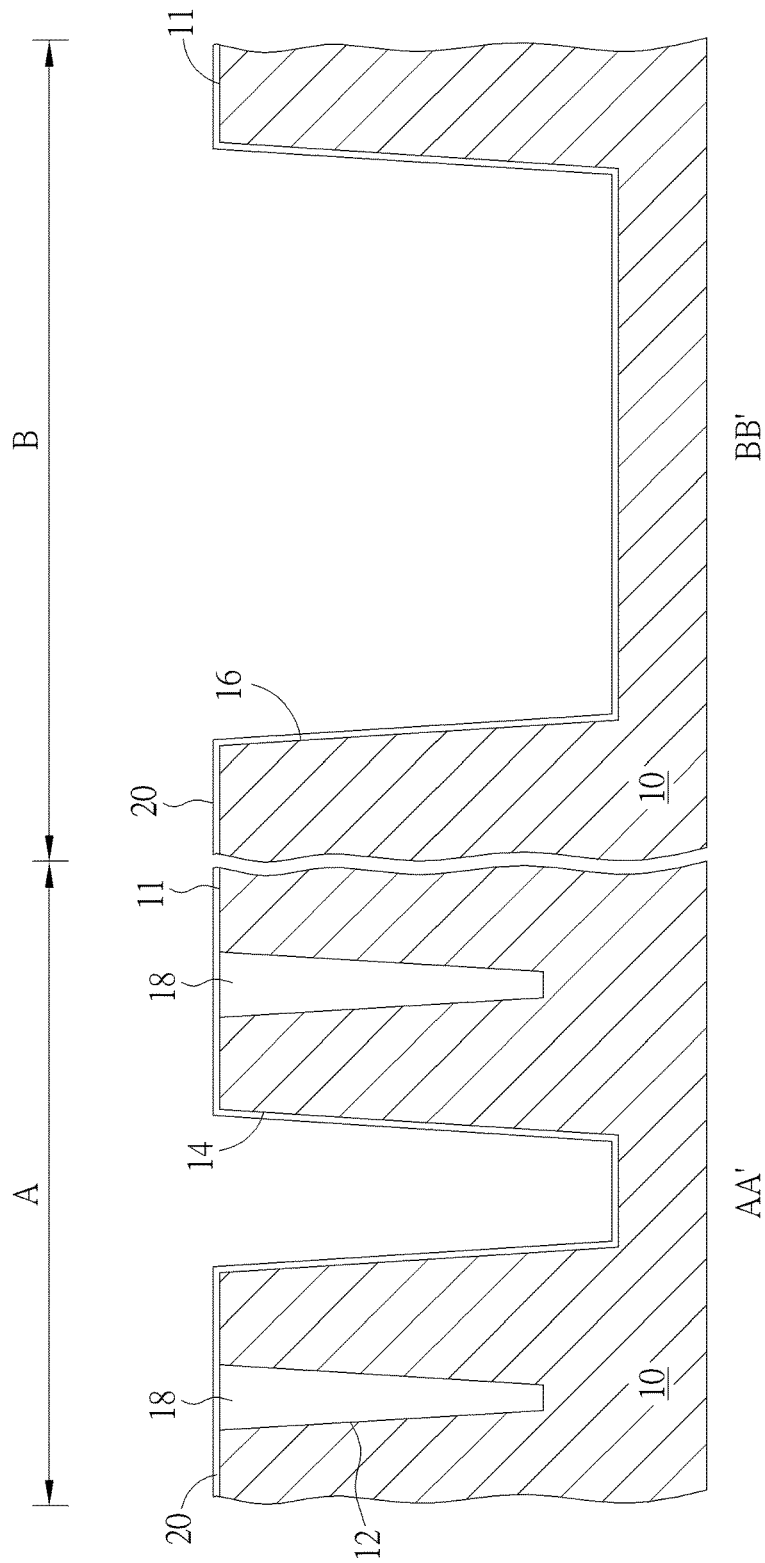

As shown in FIG. 4, the first silicon oxide layer 18 on the top surface 11, in the second trench 14 and in the third trench 16 is removed. The first silicon oxide layer 18 disposed in the first trench 12 remains. The first silicon oxide layer 18 may be removed by an isotropic etching process such as a wet etching with an etchant of hydrofluoric acid. As shown in FIG. 5, a second silicon oxide layer 20 is formed to cover the top surface 11 and conformally cover the second trench 14 and the third trench 16. According to a preferred embodiment of the present invention, the thickness of the second silicon oxide layer 20 is 2 nanometers. The second silicon oxide layer 20 may be formed by chemical vapor deposition (CVD), a physical vapor deposition (PVD) or an atomic layer deposition (ALD). According to a preferred embodiment of the present invention, the second silicon oxide layer 20 is formed by the atomic layer deposition. The second silicon oxide layer 20 serves as a liner of a silicon nitride layer formed afterwards in the second trench 14 and the third trench 16.

Figure 6:
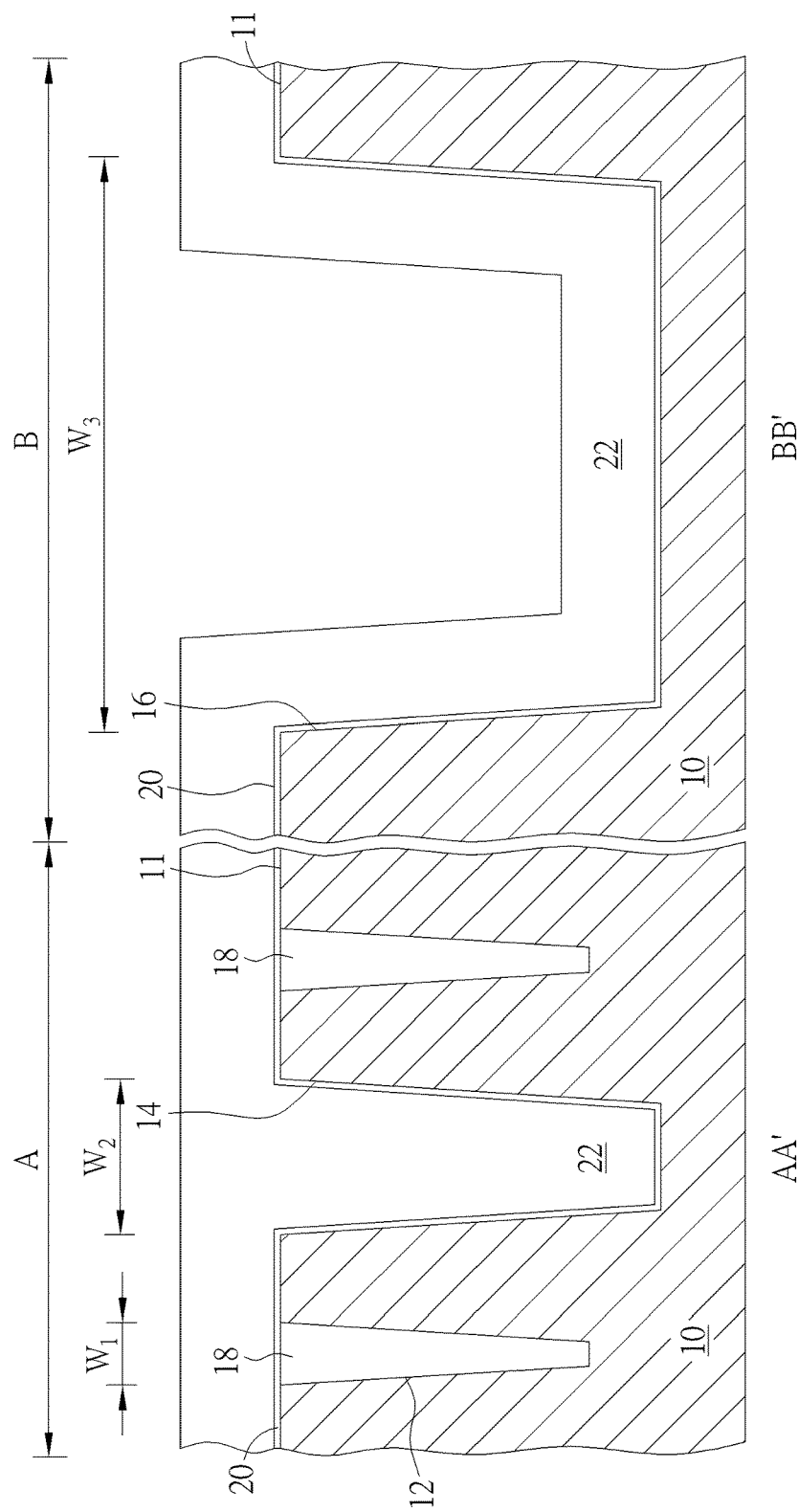

As shown in FIG. 6, a silicon nitride layer 22 is formed to conformally cover the third trench 16 and the top surface 11, and fill up the second trench 14. Because the second silicon oxide layer 20 is very thin compared to the width $W_2$ of the second trench 14, the thickness of the second silicon oxide layer 20 can be neglected. Therefore, the thickness of the silicon nitride layer 22 should be greater than half of the width $W_2$ of the second trench 14 to fill up the second trench 14. For example, if the width $W_2$ of the second trench 14 is 50 nanometers, the thickness of the silicon nitride layer 22 should be greater than 25 nanometers; preferably, the thickness of the silicon nitride layer 22 is 30 nanometers. Therefore, the silicon nitride layer 22 can fill up the second trench 14 without filling up the third trench 16. At this point, the silicon nitride layer 22 and the second silicon oxide layer 20 fill up the second trench 14.

Figure 7:
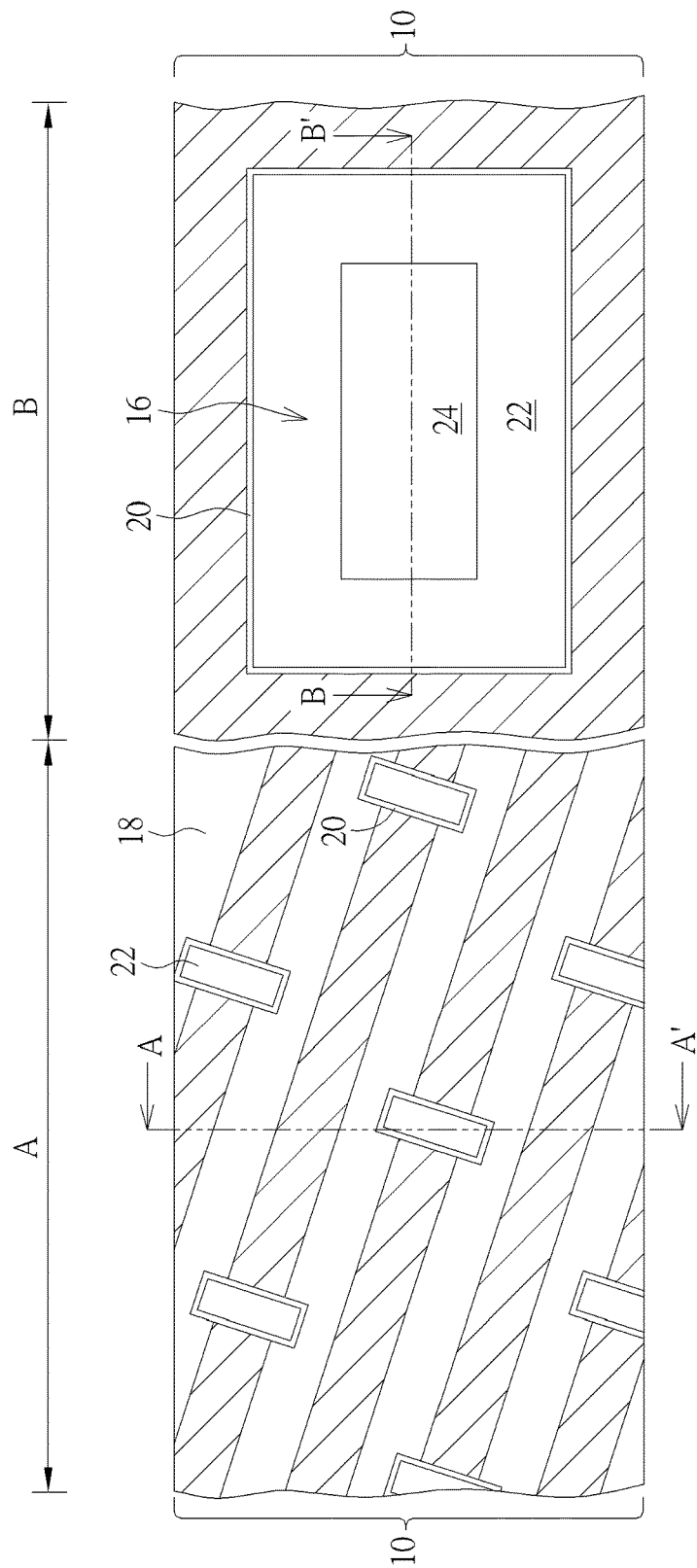
Figure 8:
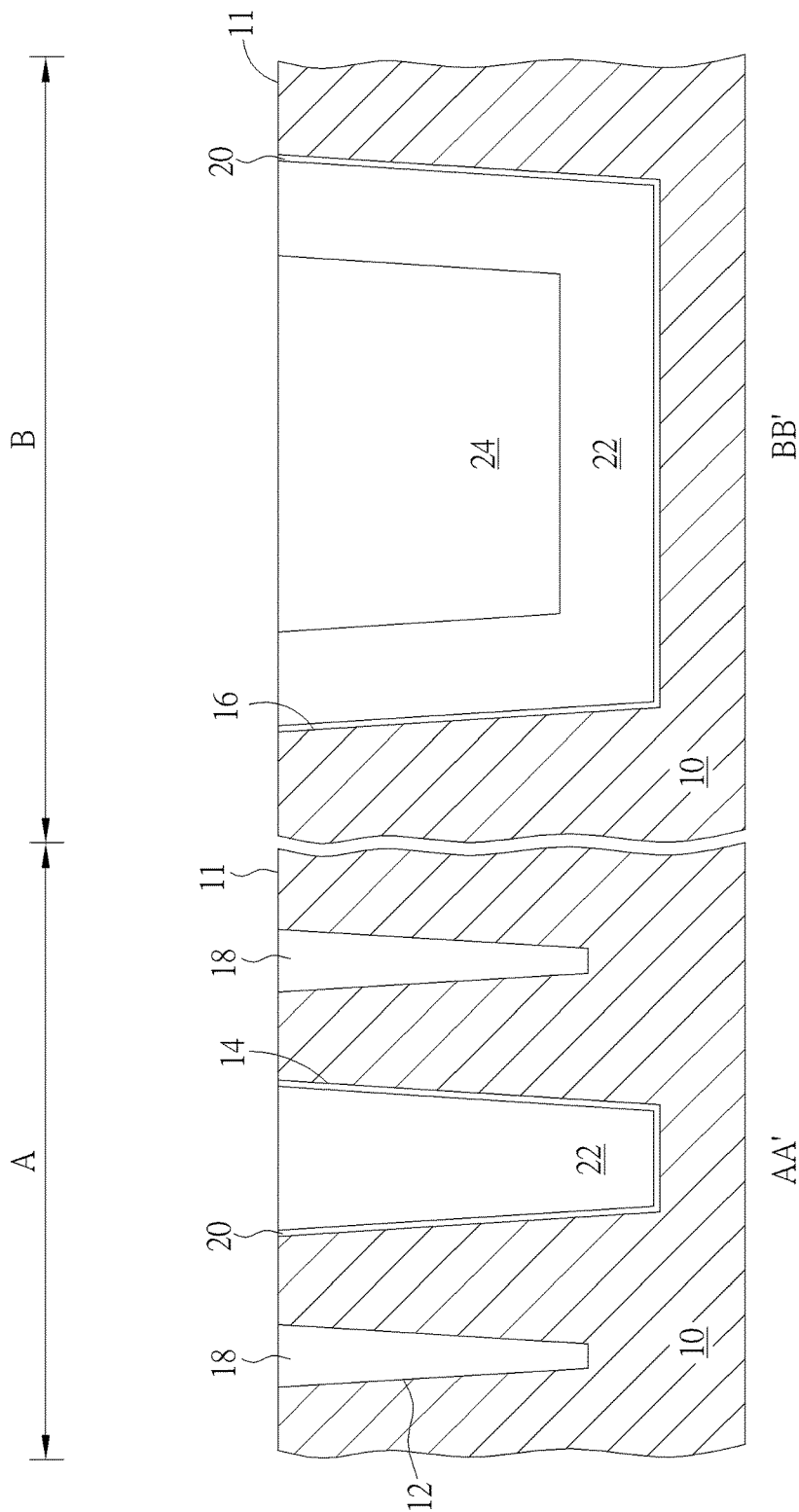

Please refer to FIG. 7 and FIG. 8. FIG. 7 is a top view of steps continuing from FIG. 6. FIG. 8 is a sectional view of FIG. 7 taken along lines A-A' and B-B'. A third silicon oxide layer 24 is formed to fill in the third trench 16. The third silicon oxide layer 24 can be formed by a spin-on glass process. The third silicon oxide layer 24 also covers the top surface 11 of the substrate 10. Later, the third silicon oxide layer 24 is planarized until the third silicon oxide layer 24 on the top surface 11 is removed entirely. At this point, the second silicon oxide layer 20, the silicon nitride layer 22 and the third silicon oxide layer 24 fill up the third trench 16.

Figure 9:
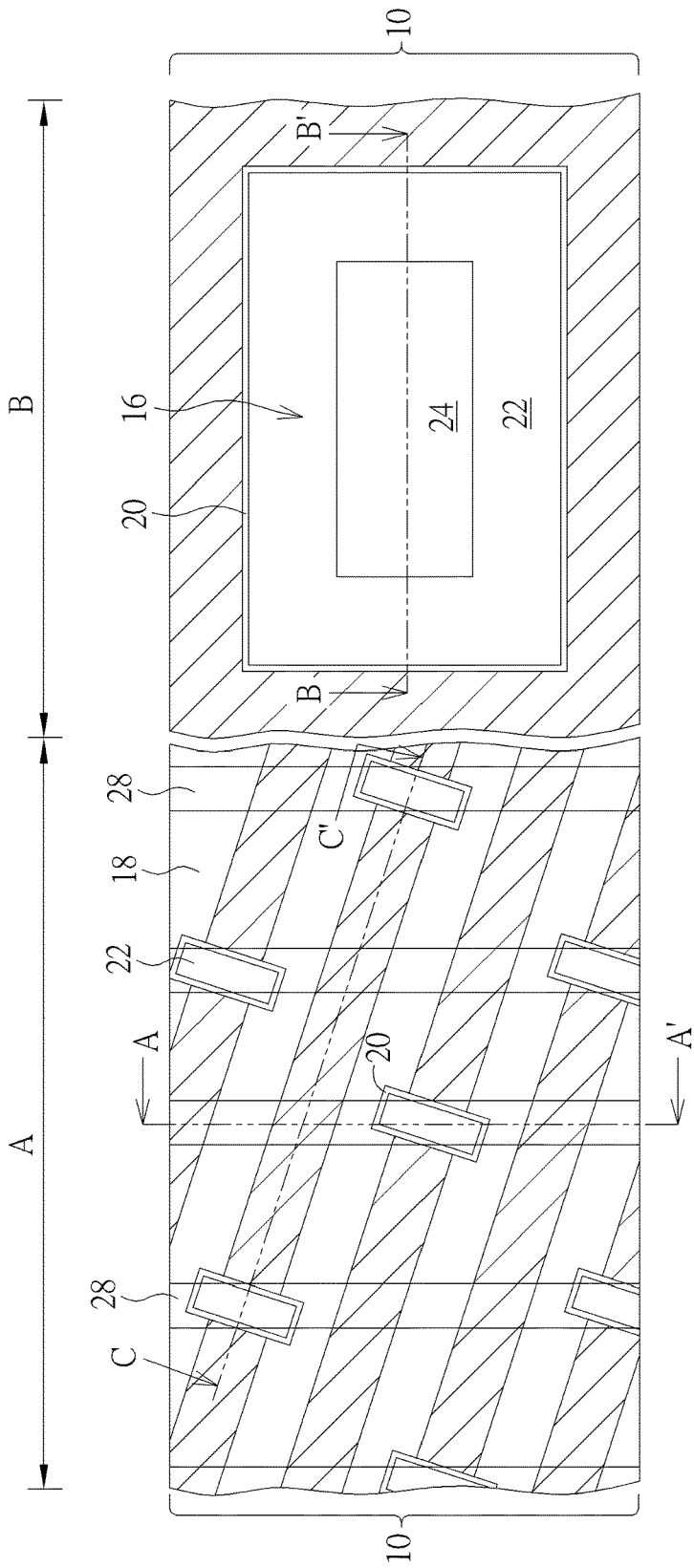
Figure 10:
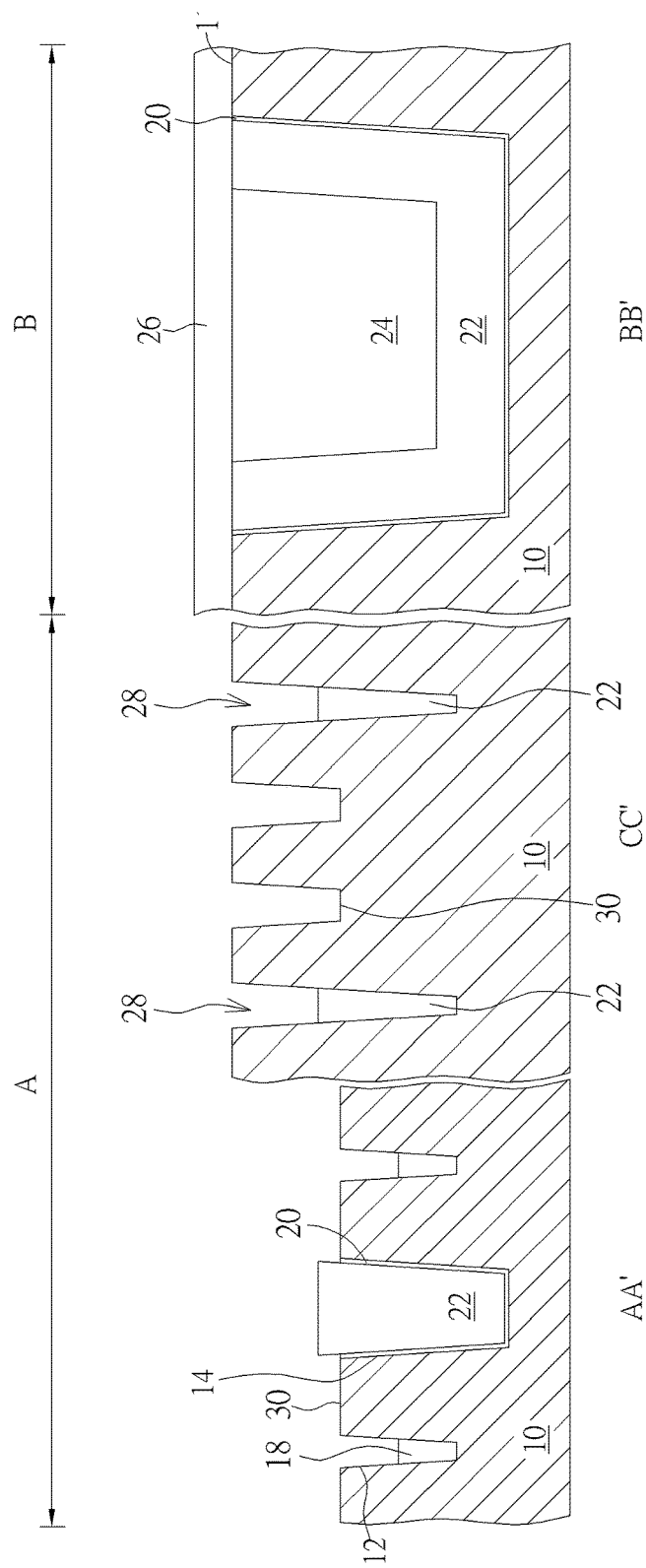

Please refer to FIG. 9 and FIG. 10. FIG. 9 is a top view of steps continuing from FIG. 7. FIG. 10 is sectional views of FIG. 9 taken along line A-A', line B-B' and line C-C'. A mask layer 26 is formed to cover the peripheral region B of the substrate 10. Later, part of the substrate 10 within the memory cell region A, part of the first silicon oxide layer 18, part of the second silicon oxide layer 20 and part of the silicon nitride layer 22 are removed to form a word line trench 28. In this embodiment, there are four word line trenches 28. It is noteworthy that the word line trench 28 is preferably formed by an etching process. The formation of the word line trench 28 uses different etching ratios of the silicon, silicon oxide and silicon nitride. Because of the different etching ratios, the substrate 10, the first silicon oxide layer 18 and the second oxide layer 20 are etched faster, and the silicon nitride layer 22 is etched slower. Therefore, when the word line trench 28 within the active area reaches a determined depth, the top surface of the silicon nitride layer 22 overlapping the word line trench 28 is still higher than the top surface of the first silicon oxide layer 18 overlapping the word line trench 28 in the first trench 12. According to a preferred embodiment of the present invention, after forming the word line trench 28, a main surface 30 of the substrate 10 within the active area is exposed. The top surface of the silicon nitride layer 22 overlapping the word line trench 28 is higher than the main surface 30. The main surface 30 will contact a word line afterwards.

Figure 11:
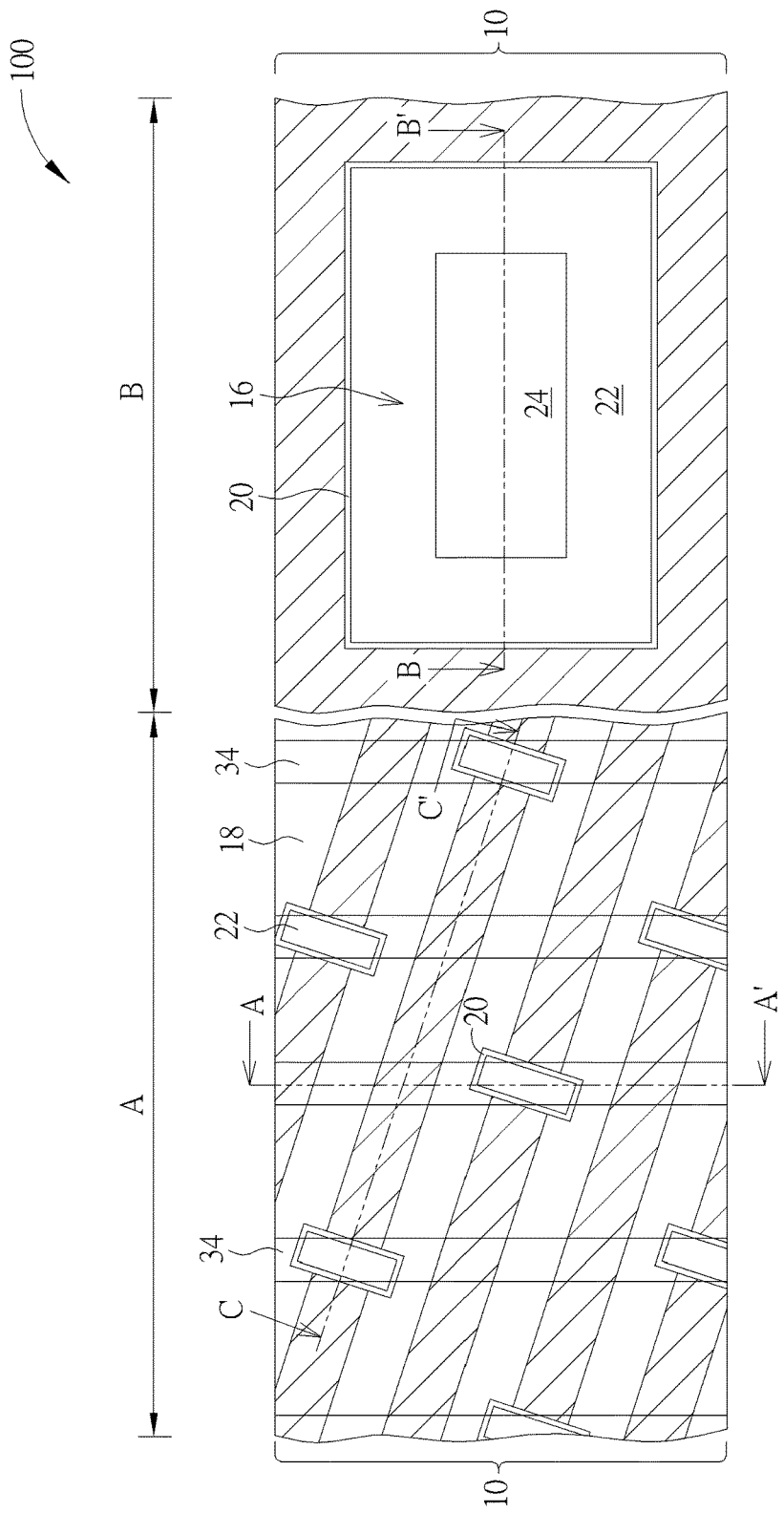
Figure 12:
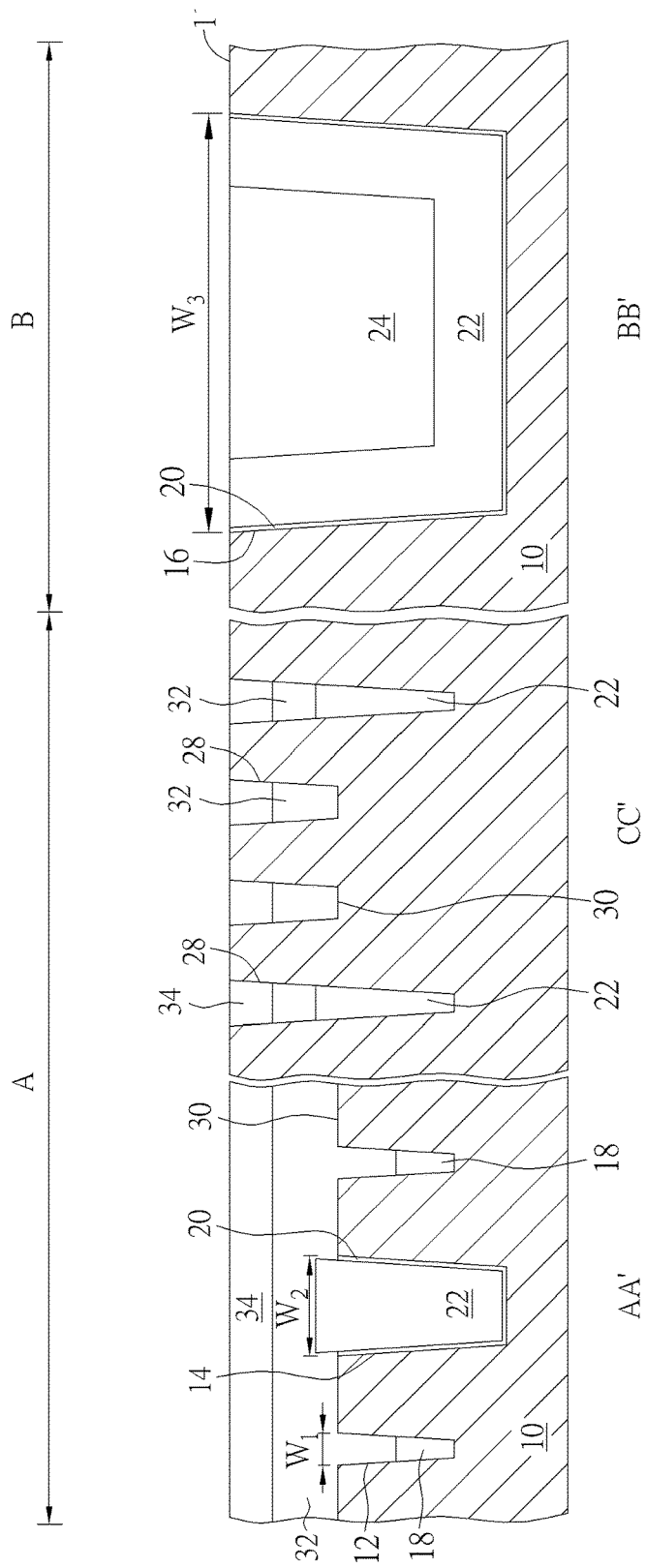

Please refer to FIG. 11 and FIG. 12. FIG. 11 is a top view of steps continuing from FIG. 9. FIG. 12 is sectional views of FIG. 11 taken along line A-A', line B-B' and line C-C'. The mask layer 26 is removed. Then, a conductive layer and an insulating layer are formed to fill in the word line trench 28 and cover the top surface 11. Later, the conductive layer and an insulating layer are planarized to remove the conductive layer and the insulating layer outside of the word line trench 28. At this point, the conductive layer remaining in the word line trench 28 serves as a word line 32, and the insulating layer remaining in the word line trench 28 serves as a cap layer 34. The word line 32 may include Ti, W, Al, Cu, Au, work function metals or low resistance metals, but is not limited to those materials. The cap layer 34 may be silicon nitride or silicon oxynitride. At this point, the word line 32 contacts the top surface 30 of the substrate 10. The top surface of the silicon nitride layer 22 overlapping the word line 32 is higher than the top surface of the first silicon oxide layer 18 overlapping the word line 32. Therefore, the interface between the word line 32 and the silicon nitride layer 22 is higher than the interface between the word line 32 and the first silicon oxide layer 18.

If the semiconductive structure with a word line is fabricated by conventional processes, the silicon nitride layer 22 would be replaced by a silicon oxide layer (hereafter replaced silicon oxide layer). Therefore, when the word line trench 28 is formed, the top surface of the silicon oxide layer 18 aligns with the top surface of the replaced silicon oxide layer. As a result, in the conventional process, the word line 32 overlapping the first silicon oxide layer 18 has the same thickness as the word line 32 overlapping the replaced silicon oxide layer. In the present invention, a thickness of the word line 32 overlapping the silicon nitride layer 22 is smaller than a thickness of the word line 32 overlapping the first silicon oxide layer 18. In the present invention, the word lines 32 passing the silicon nitride layer 22 are thinner. Therefore, the word lines 32 for forming the parasitic capacitance become smaller. In this way, the parasitic capacitance of the present invention is smaller than in the semiconductive structure formed by the conventional process, and the row hammer effect is reduced.

As shown in FIG. 11 and FIG. 12, a semiconductive structure with a word line 100 formed by the method of the present invention includes a substrate 10. The substrate 10 is divided into a memory cell region A and a peripheral region B. The substrate 10 is preferably silicon substrate. A first trench 12 and a second trench 14 are disposed in the substrate 10 within the memory cell region A. A width $W_1$ of the first trench 12 is smaller than a width $W_2$ of the second trench 14. A third trench 16 is disposed in the substrate 10 within the peripheral region B. The width $W_2$ of the second trench 14 is smaller than a width $W_3$ of the third trench 16. A first silicon oxide layer 18 is disposed at a lower portion of the first trench 12. A second silicon oxide layer 20 is disposed at a sidewall of the second trench 14 and a sidewall of the third trench 16. A silicon nitride layer 22 is disposed in the second trench 14 and covers the second silicon oxide layer 20 on the sidewall of the third trench 16. A third silicon oxide layer 24 is disposed in the third trench 16. The second silicon oxide layer 20, the silicon nitride layer 22 and the third silicon oxide layer 24 fill up the third trench 16. A word line 32 is disposed at an upper portion of the first trench 12, covers the silicon nitride layer 22 in the second trench 16 and part of the memory cell region A. The word line 32 may be Ti, W, Al, Cu, Au, work function metals or low resistance metals. A cap layer 34 is disposed on the word line 32. The cap layer 34 may be silicon nitride or silicon oxynitride. A top surface of the silicon nitride layer 22 overlapping the word line 32 in the second trench 16 is not lower than a top surface of the first silicon oxide layer 18 overlapping the word line 32 in the first trench 12. Preferably, the top surface of the silicon nitride layer 22 overlapping the word line 32 in the second trench 16 is higher than the top surface of the first silicon oxide layer 18 overlapping the word line 32 in the first trench 12. The first silicon oxide layer 18 inside the first trench 12, the first silicon oxide layer 18 and the silicon nitride layer 22 inside the second trench 14, the first silicon oxide layer 18, the silicon nitride layer 22, and the third silicon oxide layer 24 inside the third trench 16 form shallow trench isolations. The first trench 12, the second trench 14, the first silicon oxide layer 18, the second silicon oxide layer 20, the silicon nitride layer 22, the third silicon oxide layer 24 in the memory cell region A define an active area and an insulating area. The second silicon oxide layer 20, the silicon nitride layer 22 and the third silicon oxide layer 24 in the peripheral region B define another active area and another insulating area.

Figure 13:
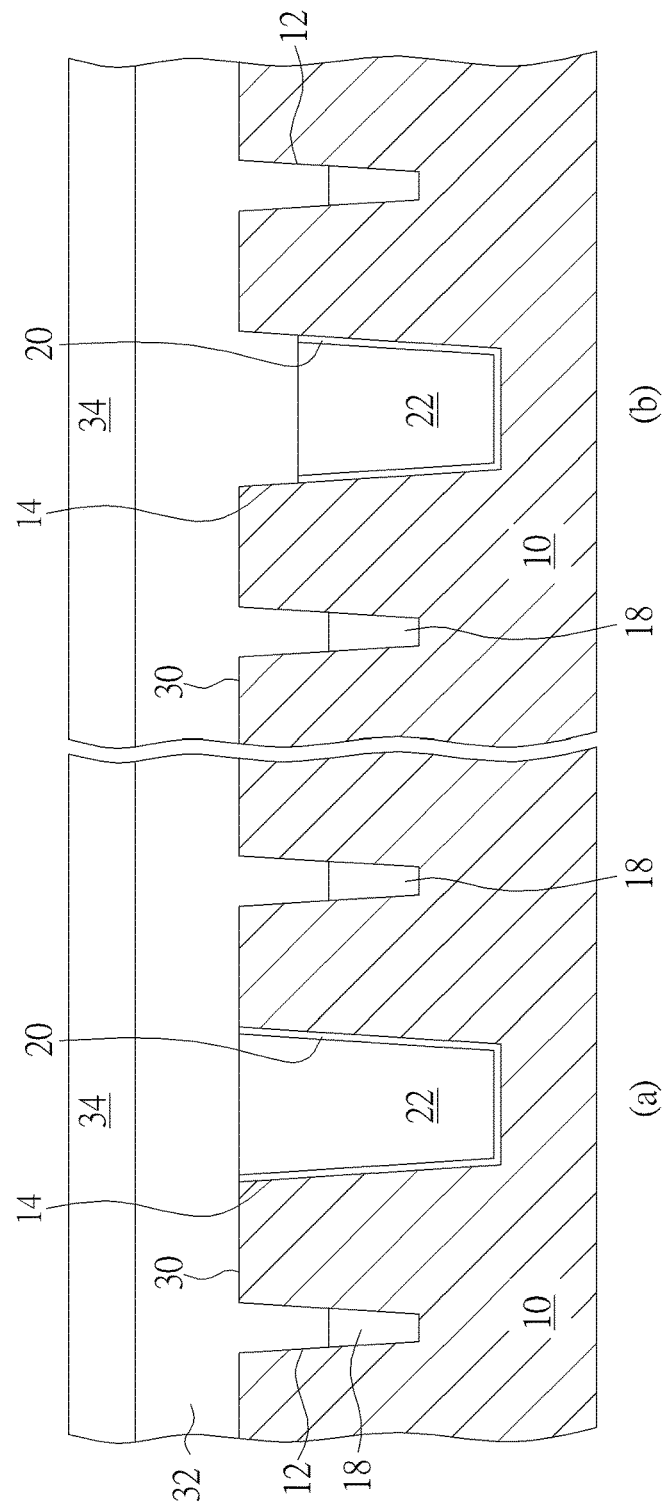

FIG. 13 depicts sectional views taken along line A-A' in FIG. 11 according to another preferred embodiment of the present invention. The thickness of the silicon nitride layer 22 in the second trench 14 overlapping the word line 32 can be altered based on different requirements. For instance, example (a) demonstrates the silicon nitride layer 22 in the second trench 14 overlapping the word line 32 aligns with the top surface 30. Example (b) demonstrates the top surface of the silicon nitride layer 22 in the second trench 14 overlapping the word line 32 is lower than the top surface 30.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductive structure with a word line, comprising:
    a substrate divided into a memory cell region and a peripheral region;
    a first trench and a second trench embedded in the substrate within the memory cell region, wherein a width of the first trench is smaller than a width of the second trench;
    a third trench embedded in the substrate within the peripheral region, wherein the width of the second trench is smaller than a width of the third trench;
    a first silicon oxide layer disposed at a lower portion of the first trench;
    a second silicon oxide layer disposed at a sidewall of the second trench and a sidewall of the third trench;
    a silicon nitride layer filling in the second trench and covering the second silicon oxide layer in the third trench;
    a third silicon oxide layer disposed within the third trench, wherein the second silicon oxide layer, the silicon nitride layer and the third silicon oxide layer fill up the third trench; and
    a word line filling in the upper portion of the first trench, covering the silicon nitride layer within the second trench, and part of the memory cell region, wherein a top surface of the silicon nitride layer overlapping the word line in the second trench is not lower than a top surface of the first silicon oxide layer overlapping the word line in the first trench.

2. The semiconductive structure with a word line of claim 1, wherein the silicon nitride layer overlaps the word line and protrudes from the second trench.

3. The semiconductive structure with a word line of claim 1, wherein the substrate overlaps the word line and comprises a main surface, and a top surface of the silicon nitride layer aligns with the main surface.

4. The semiconductive structure with a word line of claim 1, wherein the substrate overlaps the word line and comprises a main surface, and a top surface of the silicon nitride layer is lower than the main surface.

5. A method of fabricating a semiconductive structure with a word line, comprising:
    providing a substrate comprising a memory cell region and a peripheral region;
    forming a first trench and a second trench in the substrate within the memory cell region, and a third trench in the substrate within the peripheral region, wherein a width of the first trench is smaller than a width of the second trench, and the width of the second trench is smaller than a width of the third trench;
    forming a first silicon oxide layer filling up the first trench, and covering the second trench and the third trench;

removing the first silicon oxide layer in the second trench and the third trench;

forming a silicon nitride layer filling up the second trench and covering the third trench;

forming a second silicon oxide layer in the third trench, wherein the second silicon oxide layer and the silicon nitride layer fill up the third trench;

removing part of the substrate within the memory cell region, part of the first silicon oxide layer, and part of the silicon nitride layer to form a word line trench; and forming a word line in the word line trench.

6. The method of fabricating a semiconductive structure with a word line of claim 5, further comprising:

removing the first silicon oxide layer in the second trench, the third trench, and on a top surface of the substrate; and forming a third silicon oxide layer covering the second trench and the third trench.

7. The method of fabricating a semiconductive structure with a word line of claim 6, wherein the third silicon oxide layer, the second silicon oxide layer and the silicon nitride layer fill up the third trench, and the third silicon oxide layer and the silicon nitride layer fill up the second trench.

8. The method of fabricating a semiconductive structure with a word line of claim 5, wherein a thickness of the first silicon oxide layer is thicker than half of a width of the first trench.

9. The method of fabricating a semiconductive structure with a word line of claim 5, wherein a thickness of the silicon nitride layer is thicker than half of a width of the second trench.

\* \* \* \* \*